Sept. 30, 1969 H. R. BEELITZ 3,470,486

DIFFERENTIAL AMPLIFIER SINGLE ENDING CIRCUIT

Filed March 7, 1966

INVENTOR.
HOWARD R. BEELITZ
BY John V. Regan
Attorney

United States Patent Office 3,470,486
Patented Sept. 30, 1969

3,470,486
DIFFERENTIAL AMPLIFIER SINGLE ENDING CIRCUIT

Howard R. Beelitz, Kingston, N.J., assignor to RCA Corporation, a corporation of Delaware Filed Mar. 7, 1966, Ser. No. 532,376
Int. Cl. H03f 3/68
U.S. Cl. 330—30 7 Claims

ABSTRACT OF THE DISCLOSURE

Differential amplifier single ending circuit in which one of the differential amplifier outputs is directly coupled to the input of a non-inverting type amplifier, such as a voltage follower device. A level shift means directly couples the other of the differential amplifier outputs to the input of a unity gain inverting type amplifier. An impedance means connected between the outputs of the non-inverting and inverting type amplifiers functions as a mixer or adder to provide an output signal which is the sum of the output signals of the inverting and non-inverting amplifiers.

Figure 1:
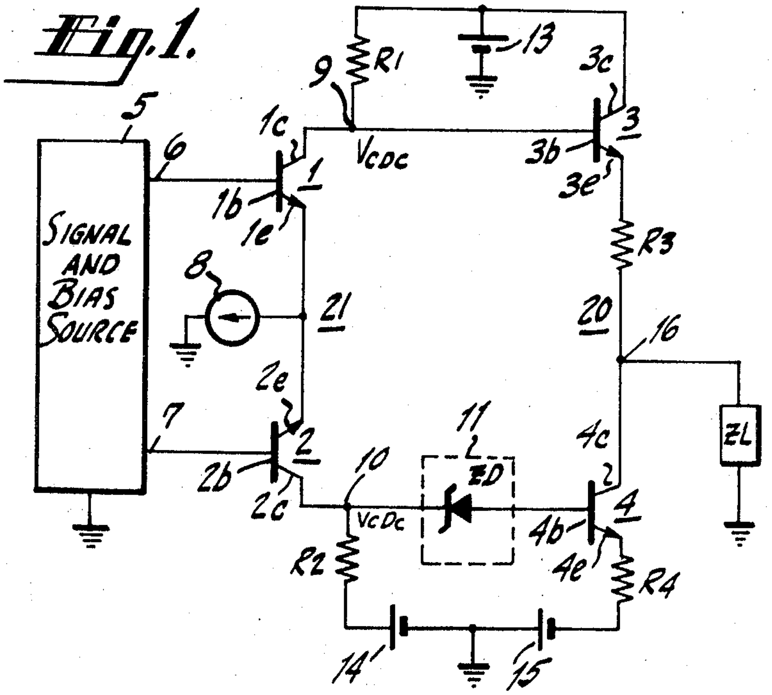

This invention relates to amplifiers, and in particular to direct coupled amplifiers having double ended inputs.

Double ended input amplifiers are widely used in operational amplifiers, sense amplifiers, and the like wherein it is often required to amplify the difference in signal condition between two input leads. In these applications the double ended input amplifier is generally called a difference or differential amplifier. In many cases, the load driven by the difference amplifier is single ended with respect to a point of fixed reference potential. In such case, it is necessary to provide a circuit means for yielding a single ended output from the difference amplifier and to provide a desired D.C. reference level at the single ended output with respect to the reference potential. An additional requirement is that the single ending circuit be substantially nonresponsive to common mode signals.

One scheme for obtaining a single ended output from a difference amplifier is to connect the load circuit to one of the amplifier's double ended outputs. This scheme, however, is often inadequate because the D.C. reference level of the difference amplifier output may be undesirable in the load circuit and because half of the differential gain is discarded. Moreover, the output signal would include common mode signal components.

An object of this invention is to provide a novel and improved amplifier.

Another object is to provide a novel circuit configuration having double ended inputs and a single ended output.

Yet another object is to provide a circuit configuration for converting the differential output signal of a difference amplifier into a single ended output signal without loss of any of the differential gain.

Still another object is to provide a double ended input and single ended output circuit capable of providing a desired D.C. reference level at the single ended output.

A further object is to provide a double ended input and single ended output circuit which is nonresponsive to common mode signals.

Briefly, the present invention is embodied as a single ending circuit for a pair of double ended inputs, which, for example, may be the outputs of a difference amplifier. One of the double ended inputs is directly coupled to the input of a noninverting type amplifier. A level shift means couples the other of the double ended inputs to the input of a unity gain inverting type amplifier. An impedance means connected between the outputs of the noninverting and inverting type amplifiers, functions as a mixer or adder to provide an output signal which is the sum of the output signals of the inverting and non-inverting amplifiers.

Figures 2, 3:
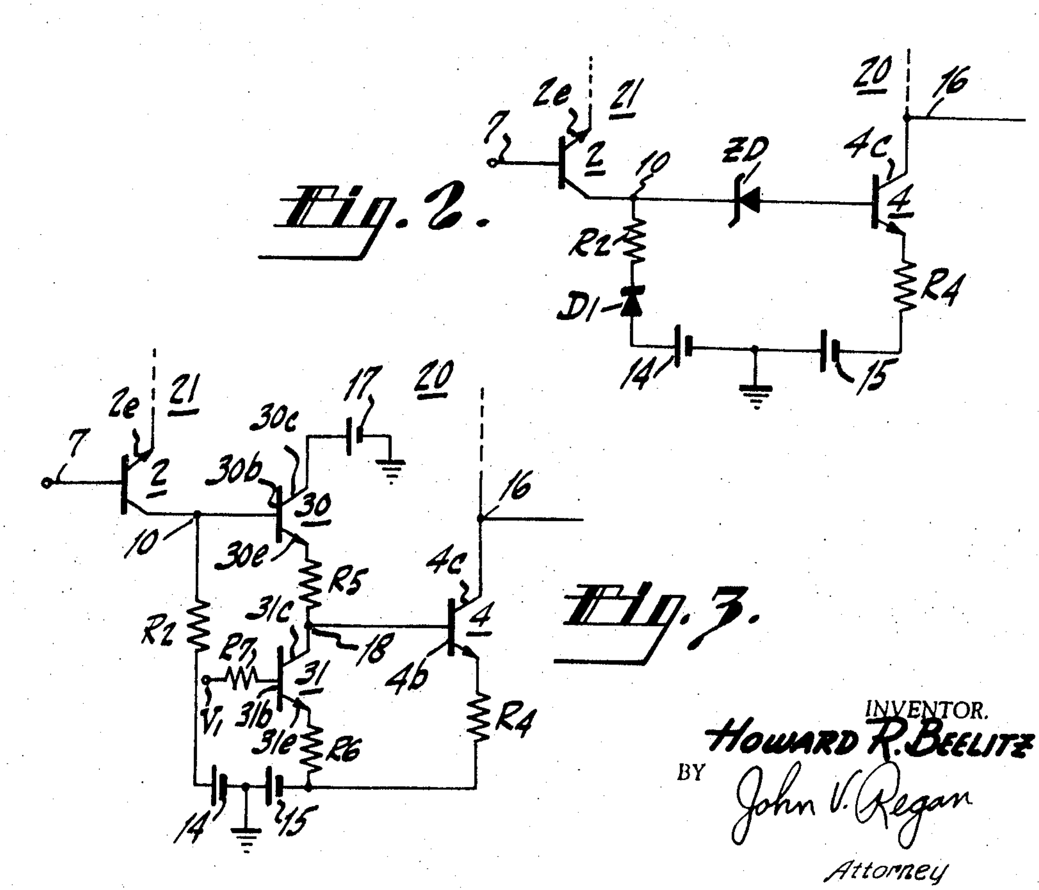

In the accompanying drawing like reference characters denote like components, and:

FIG. 1 is a schematic circuit diagram of a single ending circuit in accordance with the invention, and FIGS. 2 and 3 are partial circuit diagrams of other embodiments of the single ending circuit.

The present invention is embodied in FIG. 1 as a single ending circuit 20 for a pair of double ended inputs 9 and 10. The double ended inputs may be derived from any suitable source. For purposes of illustration, the double ended inputs are shown as being derived from a difference amplifier 21.

The difference amplifier 21 includes a pair of similar inverting type amplifying devices each having input, output and common electrodes and illustrated herein as a pair of similar bipolar transistors. However, the amplifying devices could also be any other suitable active devices such as vacuum tubes, field-effect transistors, and the like. For the illustrated bipolar transistors, the input, output and common electrodes correspond to the base, collector and emitter electrodes, respectively.

The transistor emitter electrodes 1*e* and 2*e* are connected in common to a current determining element 8, illustrated as a substantially constant current source having its other terminal connected to a fixed reference potential. The fixed reference potential is illustrated as being ground potential as shown by the conventional symbol for ground in FIG. 1. The current source 8 is conventional in nature and may include a transistor (not shown). The transistor collector electrodes 1*c* and 2*c* are connected to the double ended points 9 and 10, respectively. A collector resistor R1 further connects the collector electrode 1*c* to the positive terminal of a source of operating voltage 13, illustrated as a battery having its negative terminal connected to circuit ground. Another collector resistor R2 further connects the collector electrode 2*c* to the positive terminal of a source of operating voltage 14, illustrated as a battery having its negative terminal connected to circuit ground. The transistor base electrodes 1*b* and 2*b* are connected to the output terminals 6 and 7, respectively, of a signal and bias source 5 which are referenced to the ground potential as illustrated in FIG. 1.

The signal and bias source 5 includes appropriate circuitry to provide at its outputs 6 and 7 difference signals and bias voltage for the base electrodes of the difference transistors 1 and 2. The source 5 may, for example, include preceding difference amplifying stages and the sensing system of a magnetic memory.

A single ending circuit 20 includes a noninverting type amplifying device 3 and an inverting type amplifying device 4. Again the amplifying devices are illustrated as bipolar transistors. The transistor 3 is connected in the emitter follower configuration whereby its base, emitter and collector electrodes correspond to the input, output and common electrodes, respectively. To this end, the base electrode 3*b* is directly connected to the double ended circuit point 9 and the collector electrode 3*c* is directly connected to the positive terminal of the voltage source 13. It should be noted that a separate voltage source could be provided for the collector electrode 3*c*, if desired. The emitter electrode 3*e* is connected by way of a resistor R3 to an output connection 16. A load impedance $Z_L$ representative of the input impedance of the load circuit is connected between the output 16 and fixed ground potential. Also connected to the output connection 16 is the collector electrode *4c* of the transistor 4.

The transistor 4 is connected in the common emitter configuration such that its base, collector and emitter electrodes correspond to the input, output and common electrodes of an amplifying device. To this end, the emitter electrode *4e* is connected by way of an emitter resistor R4 to the negative terminal of a voltage source 15, illustrated as a battery having its positive terminal connected to the ground reference potential. The base electrode *4b* is connected by way of a level shift means 11 to the double ended circuit point 10. The level shift means 11 is herein illustrated as a Zener diode ZD, having its anode connected to the base electrode *4b* and the cathode connected to the double ended circuit point 10.

In the operation of the difference amplifier 21 and the single ending circuit 20, let us first consider the static D.C. operating conditions. In the difference amplifier 21, the transistors 1 and 2 are identical types and the collector resistors R1 and R2 are identical in value. The voltage sources 13 and 14 have substantially the same value; and the source 5 provides the same bias voltage to each base electrode *1b* and *2b* so that both transistors 1 and 2 are equally biased into conduction. The current of the current determining element 8 divides equally at the common connection of the emitter electrodes *1e* and *2e*. The collector currents are identical and the D.C. collector voltages are identical such that the same D.C. voltage level $V_{CDC}$ is present at the double ended circuit points 9 and 10.

As mentioned previously, the D.C. voltage level $V_{CDC}$ may be undesirable in the load circuit. The single ending circuitry 20 of the present invention provides any desired D.C. level at the output connection by the appropriate selection of the values of the resistors R3 and R4, the values of the voltage source 15 and the amount of voltage drop $V_{LS}$ of the level shift means 11. The D.C. voltages at the base electrodes *3b* and *4b* differ by the voltage drop $V_{LS}$ across the level shift means 11. For identical transistors, the D.C. voltages at the emitter electrodes *3e* and *4e* also differ by the same amount $V_{LS}$ since the base-to-emitter voltage drop $V_{BE}$ is the same for each transistor.

Recognizing that the parameter $\alpha$ of a transistor is substantially unity, the collector and emitter currents of transistor 4 are substantially equal. By making resistors R3 and R4 equal in value, the voltage drops $V_{R3}$ and $V_{R4}$ therefore become equal and can be expressed as follows:

$$V_{R3}=V_{R4}=V_{CDC}-V_{BE}-V_{LS}-V_{15} \qquad (1)$$

where $V_{15}$ is the voltage of battery 15. Consequently, by selecting the values of the level shift voltage $V_{LS}$ and of the battery voltage $V_{15}$, the D.C. reference level at the output connection 16 can be set to any desired level.

For example, by making the battery voltage $V_{15}$ equal to $-V_{LS}$ volts, the latter two terms in Equation 1 cancel so that the voltages across R3 and R4 become equal to $V_{CDC}-V_{BE}$. Since the voltage drop $V_{CDC}-V_{BE}$ is the same as the voltage at the emitter electrode *3e* of transistor 3, the D.C. reference level at the output connection 16 is 0 volt. Other D.C. reference levels at the output connection 16 are possible by making the battery voltage $V_{15}$ larger or smaller so long as transistor 4 remains operative in the linear range.

In addition to providing a desired D.C. voltage level at the output 16, the single ending circuit 20 preserves the full differential gain of the difference amplifier 21. Consider that the difference amplifier 21 responds to a difference signal applied by the source 5 to provide a signal $+\Delta S$ at the circuit point 9 and a signal $-\Delta S$ at the circuit point 10. The emitter electrode *3e* of the emitter follower transistor 3 follows its base electrode *3b*. Therefore, the signal $\Delta S$ also appears at the emitter electrode *3e*. Since the output impedance of transistor 4 is very large as compared to resistor R3 (R3 is typically on the order of 1000 ohms), the signal $+\Delta S$ suffers very little attenuation and appears at the output 16.

Since transistor 4 has equal valued resistors R3 and R4 connected in its collector and emitter circuits, its voltage gain is unity. In other words, the transistor 4 operates as a unity gain inverting type amplifying device. Consequently, the signal $-\Delta S$ at the base electrode *4b* becomes $-(-\Delta S)$ or $+\Delta S$ at the collector electrode *4c*. Thus, the net output signal is $2\Delta S$, the sum of the two signal components, and there is no loss of any of the differential gain.

The single ending circuit 20 has another important feature in that it is relatively nonresponsive to common mode signals. A common mode signal is a signal which causes the double ended circuit points 9 and 10 to both go positive or negative at the same time. The common mode signals may be introduced by either the signal and bias source 5 or by drift of the positive supply voltage. With respect to common mode signals introduced by the signal and bias source 5, there is a substantial cancellation of the common mode signal at the output connection 16 due to the following action of the transistor 3 and the inverting action of the transistor 4. For example, a $+\Delta S$ common mode signal at circuit point 9 becomes a $+\Delta S$ common mode signal at the output connection 16. On the other hand, a $+\Delta S$ common mode signal at the circuit point 10 becomes a $-\Delta S$ signal at the output 16 due to the inverting action of the transistor 4. Thus, the net output signal is 0.

With respect to drift of the positive supply voltage, it should be noted that in practice, the voltage supplies 13 and 14 would be derived from the same source of supply. Consequently, any drift in voltage of such a single supply would affect the D.C. voltage $V_{CDC}$ at double ended circuit points 9 and 10 in the same manner. Consequently, the drift of the positive supply is similar to a common mode signal. As mentioned previously, the D.C. voltage level at the emitter electrode *3e* is a function of the D.C. voltage level $V_{CDC}$. According to equation 1, the voltage $V_{R3}$ across resistor R3 is also a function of the D.C. voltage $V_{CDC}$. The resistor R3 performs a mixing or adding function to substantially cancel to voltage $V_{CDC}$, and thus any variations thereof, so that the output 16 is unaffected by drift.

When the single ending circuit 20 is fabricated as an integrated circuit structure, the Zener diode ZD may take any of the conventional forms. For instance, the reverse breakdown voltage of the emitter-to-base junction of a transistor may be utilized to provide the Zener voltage. Moreover, the level shift means 11 may be any of the conventional level shift devices. For example, the forward voltage drop of a conventional diode or a plurality of diodes may replace or be used in combination with the illustrated Zener diode ZD. These diodes may all be connected either to provide voltage shift only between the circuit point 10 and the base electrode *4b* or connected to provide voltage shift between the positive terminal of voltage supply 14 and base electrode *4b*. An illustration, in part, of the latter type of level shift arrangement is shown in FIG. 2.

In FIG. 2 a diode D1 is connected for forward conduction between the positive terminal of the voltage supply 14 and the collector resistor R2. The dashed lines from the emitter electrode *2e* and the output connection 16 go to the remainder of the circuit which is the same as shown in FIG. 1. As mentioned previously, the base bias conditions and constant current source 8 equally bias transistors 1 and 2 into conduction. The collector currents of the difference transistors 1 and 2 are substantially identical so that the voltage drops across the collector resistors are substantially identical. However, the D.C. voltage levels at the circuit points 9 and 10 now differ by the forward voltage drop of the diode D1. Thus, the level shift voltage $V_{LS}$ includes both the Zener voltage and the forward voltage drop of the diode D1. In all other respects, the circuit operates in substantially the same way as the circuit described in FIG. 1.

The single ending circuit 20 may also take on the form illustrated in FIG. 3 wherein the Zener diode ZD is replaced by a transistor 30 connected in the emitter follower configuration. To this end, the base electrode **30*b* is connected to the circuit point 10. Collector electrode 30*c* is connected to the positive terminal of a source of operating voltage 17, the negative terminal of which is connected to circuit ground. The emitter electrode 30*e* is connected by way of emitter resistor R5 to a circuit point 18 which, in turn, is connected to the base electrode 4*b* of the unity gain inverting type transistor 4**.

Circuit point 18 is also connected to the collector electrode **31*c* of a current source transistor 31. The emitter electrode 31*e* is connected by way of emitter resistor R6 to the negative terminal of the voltage source 15. The base electrode 31*b* is connected by way of a base resistor R7 to a source of reference voltage $V_1$. The source of reference voltage $V_1$ may be derived by means of a voltage divider and a source of positive voltage supply, for example, battery 14. Again the dashed connections from the emitter electrode 2*e* and the output connection 16** go to the remainder of the circuit which is the same as shown in FIG. 1.

In operation, the collector current of current source transistor 31 is substantially constant so that the voltage drop across emitter resistor R5 is substantially constant. Thus, the base-to-emitter junction voltage drop of transistor 30 and the constant voltage drop across resistance R5 comprise the level shaft voltage $V_{LS}$. Also, since the output impedance of the current source transistor 31 is large compared to the emitter resistor R5 (on the order of 1000 ohms), there is substantially no signal attenuation by the resistor R5. In all other respects, the FIG. 3 circuit operates in substantially the same way as the circuit described in FIG. 1.

The embodiment of the invention illustrated in FIG. 3 is capable of a different type of operation. By changing the voltage $V_1$ from a fixed reference voltage to a variable control voltage, the translation of the difference signal from the double ended circuit points 9 and 10 to the single ended output 16 can be controlled. For example, the control voltage $V_1$ could be a bi-level strobe signal whereby the D.C. voltage level at the output 16 has first and second values corresponding to the two levels of the strobe signal. That is, the output D.C. voltage has a first value when the strobe signal is at the lower of its two levels and a second value when the strobe signal is at the higher of its two levels.

A threshold device (not shown), such as a flip-flop can be connected to the output connection 16. When the strobe signal is at one of its two levels, the output signal and the D.C. output voltage level would be insufficient to exceed the threshold of the flip-flop so that the flip-flop does not respond thereto. On the other hand, when the strobe signal is at the other of its two levels, the output signal and the D.C. output voltage would be sufficient to exceed the threshold of the flip-flop so that the flip-flop switches. Thus, the control voltage $V_1$ can be used to provide a strobing function for a sense amplifier.

Although the invention has been illustrated with transistors of the NPN type, it is apparent that transistors of the PNP type can be used so long as the polarities of the diodes and the bias supplies are appropriately changed.

What is claimed is:

1. The combination comprising:
- first and second operating power terminal means adapted to receive operating voltage of first and second values, respectively,
- difference amplifier means adapted to produce at a pair of leads difference signals and a D.C. voltage having a value intermediate the first and second values,
- first and second impedances having substantially the same value,
- first and second amplifying devices, each having an input, an output and a common lead,
- first means for coupling said first device as a voltage follower device and said second device as a unity gain inverter, said first means including a series circuit of the first power terminal, the common and output leads of the first device, the first impedance, the output and common leads of the second device, the second impedance and the second power terminal in the named order,
- second means for directing coupling the input lead of the first device to one of said pair of difference leads,
- third means including level shift means for direct coupling the input lead of the second device to the other of the difference leads, and
- output means including a connection to the second device output lead.

2. The invention according to claim 1
- wherein each of said amplifying devices is a transistor having a base, an emitter, and a collector lead, and
- wherein the base, collector and emitter leads of the first transistor correspond to the input, common and output leads, respectively, and the base, emitter and collector leads of the second transistor correspond to the input, common and output leads, respectively.

3. The invention according to claim 6
- wherein said level shift means includes a third impedance element, a substantially constant current source and a third transistor having a base-emitter junction, and
- wherein said third means (1) couples said third impedance, said current source and the base lead of the second transistor together and (2) couples said third transistor as an emitter follower having its base-emitter junction connected between said other difference lead and the free end of the third impedance.

4. The invention according to claim 3
- wherein said substantially constant current source includes a fourth transistor having base, emitter and collector leads,
- wherein said third means couples said fourth collector lead to said third transistor emitter lead by way of said third impedance element and said fourth transistor emitter lead to the second power terminal, and
- wherein said third means includes a connection to said fourth transistor base electrode.

5. The invention according to claim 7 wherein the value of the voltage shift occasioned by said level shift means is substantially equal to the second value of operating voltage.

6. The invention according to claim 2 wherein said level shift means is connected between said other difference lead and the base lead of said second transistor.

7. The invention according to claim 6 wherein said level shift means includes a Zener diode.

References Cited

UNITED STATES PATENTS

| | | | |
|---|---|---|---|
| 3,089,962 | 5/1963 | Foote | 307—318 X |
| 3,308,309 | 3/1967 | Wichmann | 330—14 X |
| 3,328,713 | 6/1967 | Ito et al. | 330—15 |
| 3,370,245 | 2/1968 | Royce et al. | 330—69 X |

ROY LAKE, Primary Examiner

LAWRENCE J. DAHL, Assistant Examiner

U.S. Cl. X.R.

330—14